(12) United States Patent
Qiu et al.

(10) Patent No.: US 8,289,463 B2
(45) Date of Patent: Oct. 16, 2012

(54) MANUFACTURING METHOD FOR A THIN FILM TRANSISTOR-LIQUID CRYSTAL DISPLAY HAVING AN INSULATING LAYER EXPOSING PORTIONS OF A GATE ISLAND

(75) Inventors: Haijun Qiu, Beijing (CN); Zhangtao Wang, Beijing (CN); Xu Chen, Beijing (CN); Tae Yup Min, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 13/273,460

(22) Filed: Oct. 14, 2011

(65) Prior Publication Data

US 2012/0034722 A1 Feb. 9, 2012

Related U.S. Application Data

(62) Division of application No. 13/069,767, filed on Mar. 23, 2011, now Pat. No. 8,040,452, which is a division of application No. 11/834,118, filed on Aug. 6, 2007, now Pat. No. 7,916,230.

(30) Foreign Application Priority Data

Aug. 4, 2006 (CN) .......................... 2006 1 0103865
Aug. 4, 2006 (CN) .......................... 2006 1 0103866

(51) Int. Cl.
G02F 1/136 (2006.01)
G02F 1/1343 (2006.01)
G02F 1/13 (2006.01)

(52) U.S. Cl. ........................... 349/43; 349/148; 349/187

(58) Field of Classification Search .................. 349/187; 438/149, 153, 311, 151, 154, 163
See application file for complete search history.

(56) References Cited

U.S. PATENT DOCUMENTS

| 2002/0158994 | A1* | 10/2002 | Hashimoto et al. | 349/43 |
| 2002/0159010 | A1* | 10/2002 | Maeda et al. | 349/113 |
| 2003/0193626 | A1* | 10/2003 | Lim | 349/43 |
| 2007/0269937 | A1* | 11/2007 | Lin | 438/149 |

* cited by examiner

*Primary Examiner* — Mark Robinson
*Assistant Examiner* — Paul Lee
(74) *Attorney, Agent, or Firm* — Hasse & Nesbitt LLC; Daniel F. Nesbitt

(57) ABSTRACT

A pixel unit of TFT-LCD array substrate and a manufacturing method thereof is disclosed. In the manufacturing method, besides a first insulating layer and a passivation layer, a second insulating layer is adopted to cover the gate island, and forms an opening on the gate island to expose the channel region, the source region and the drain region of the TFT. A gray tone mask and a photoresist lifting-off process are utilized to perform patterning, so that the TFT-LCD array substrate can be achieved with just three masks.

6 Claims, 8 Drawing Sheets

MANUFACTURING METHOD FOR A THIN FILM TRANSISTOR-LIQUID CRYSTAL DISPLAY HAVING AN INSULATING LAYER EXPOSING PORTIONS OF A GATE ISLAND

CROSS-REFERENCE TO RELATED APPLICATIONS

This application is a divisional application of U.S. Ser. No. 13/069,767, filed Mar. 23, 2011 now U.S. Pat. No. 8,040,452, which is a divisional application of U.S. Ser. No. 11/834,118 filed Aug. 6, 2007 (now U.S. Pat. No. 7,916,230 that issued Mar. 29, 2011), which claims the priority of Chinese Patent Application Nos. CN200610103866.0 and CN 200610103865.6 both filed Aug. 4, 2006, the disclosures of which are incorporated herein by reference.

FIELD OF THE INVENTION

The present invention relates to a thin film transistor liquid crystal display (TFT-LCD) array substrate and a manufacturing method thereof, and more particularly, to a TFT-LCD array substrate manufactured with three masks and a manufacturing method thereof.

BACKGROUND OF THE INVENTION

A liquid crystal display (LCD) comprises an upper substrate, a lower substrate, and a liquid crystal layer interposed therebetween. A common electrode and color filters are formed on the upper substrate, which is generally called a color filter substrate. The lower substrate is generally called an array substrate, on which a plurality of gate lines parallel to each other and a plurality of data lines parallel to each other are formed. The gate lines and data lines intersect with each other orthogonally, defining a plurality of pixel units in a matrix on the substrate. In each of the pixel unit, a pixel electrode and a switching element such as a thin film transistor (TFT) connected with the pixel electrode are included. The gate electrode of the TFT is connected with one of the gate lines, and the source electrode of the TFT is connected with one of the data lines.

The conventional method of manufacturing a TFT-LCD array substrate generally employs a five-mask (5Mask) technology or a four-mask (4Mask) technology. The 4Mask technology performs etching on both the source/drain metal layer and the active layer in the channel region of the TFT by using a gray tone mask. Such conventional 4Mask technology comprises the following steps.

Firstly, a gate metal layer is formed on the substrate by a conventional gate process, and then a gate insulating layer is formed by depositing.

Secondly, a semiconductor layer (active layer), a doped layer (ohmic contact layer), a source/drain metal layer are deposited sequentially on the substrate. A gate island of the TFT is formed by coating a photoresist layer and patterning with a gray tone mask, an ashing process is performed on the photoresist layer to expose the channel region of the TFT, the source/drain metal layer in the channel region is etched, and thereafter the doped layer and the active layer in the channel region are etched. Since it is necessary to etch the metal layer, the doped layer, and the active layer in the above processes, the photoresist in the gray toned region in the channel portion should be controlled strictly. In addition, there are strict requirements on the selection ratio and uniformity of the etching, and accordingly there are strict requirements on the process tolerance.

SUMMARY OF THE INVENTION

One object of the present invention is to overcome the drawbacks in the related arts by providing a pixel unit of a TFT-LCD array substrate and the manufacturing method thereof, which not only can reduce the requirements on the process tolerance and simplifies the design of the TFT but also can obtain the array substrate with just reduced masks.

To achieve the above object, one embodiment according to the present invention provides a pixel unit of a TFT-LCD array substrate, comprising: a substrate; a TFT formed on the substrate; a passivation layer covering the TFT; and a pixel electrode connected with the TFT. The TFT comprises: a gate island formed by a gate electrode, a first insulating layer, an active layer, and an ohmic contact layer stacked sequentially on the substrate, wherein the ohmic contact layer is formed in a source region and a drain region and exposes the active layer in a channel region; a second insulating layer, covering the gate island and forming on the gate island an opening which exposes the source region, the drain region and the channel region; a source electrode and drain electrode, formed on the second insulating layer and electrically connected with the ohmic contact layer in the source region and the drain region, respectively. The pixel electrode is formed on the second insulating layer and is connected with the drain electrode of the TFT.

Another embodiment according to the present invention provides a manufacturing method of a pixel unit of a TFT-LCD array substrate, comprising the steps of: depositing sequentially on a substrate stacked layers of a gate metal layer, a first gate insulating layer, an active layer, and an ohmic contact layer, and then patterning the stacked layers to form a gate island; depositing sequentially a second insulating layer and a source/drain metal layer on the substrate, patterning the second insulating layer and the source/drain metal layer, forming a source electrode on the second insulating layer, and forming an opening on the gate island to expose the ohmic contact layer in a source region, a drain region, and a channel region of the TFT; depositing a pixel electrode material layer on the substrate, patterning the pixel electrode material layer and the ohmic contact layer exposed in the opening so that the ohmic contact layer on the channel region is removed, the source electrode is connected with the ohmic contact layer in the source region via the pixel electrode material layer on the source electrode, the drain electrode and the pixel electrode connected with each other are formed on the second insulating layer, and the drain electrode is connected with the ohmic contact layer in the drain region; and depositing a passivation layer on the substrate to cover the TFT.

Further another embodiment according to the present invention provides another manufacturing method of a pixel unit of a TFT-LCD array substrate, comprising the following steps of depositing sequentially on a substrate stacked layers of a gate metal layer, a first gate insulating layer, an active layer, and an ohmic contact layer, and then patterning the stacked layers to form a gate island; depositing sequentially a second insulating layer and a pixel electrode material layer on the substrate, patterning the second insulating layer and the pixel electrode material layer, so as to form an opening on the gate island to expose the ohmic contact layer in a source region, a drain region, and a channel region of the TFT, and form a pixel electrode; depositing a source/drain metal layer on the substrate, and patterning the ohmic contact layer exposed in the opening and the source/drain metal layer, so as to form on the second insulating layer a source electrode connected with the ohmic contact layer in the source region and a drain electrode connected with the ohmic contact layer in the drain region, and remove the ohmic contact layer on the channel region; and depositing a passivation layer on the substrate.

Compared with the conventional manufacturing method of array substrate in the related art, besides a first insulating layer (a gate insulating layer) and a passivation layer, the pixel unit and the method according to the present invention form a second insulating layer to cover the gate island, form an opening on the gate island to expose the channel region of TFT as well as the source region and the drain region, and conduct patterning with a gray tone mask and a photoresist lifting-off process, so that the TFT-LCD array substrate is possible to be completed with just three masks, which increases the feasibility of the process, reduces the manufacturing cost of the array substrate process and occupied time of the equipment, and improves productivity.

The present invention will be described in detail by reference to the accompanying drawings and the preferred embodiments.

DESCRIPTION OF THE PREFERRED EMBODIMENTS

The preferred embodiments of the TFT LCD array substrate according to the present invention will be described in detail with reference to the accompanying drawings.
The First Embodiment The TFT-LCD array substrate and the manufacturing method thereof according to the first embodiment of the present invention will be described in detail with reference to FIGS. 1a-3f.

Figure 1A:
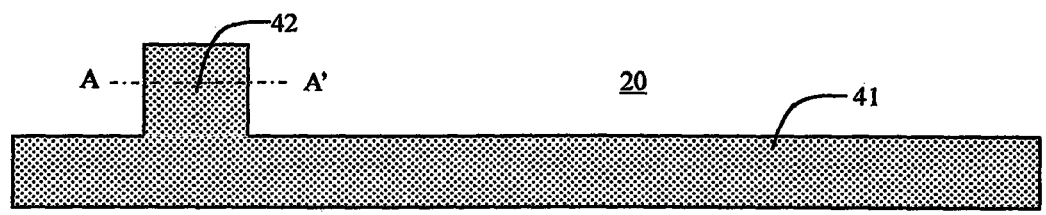
FIG. 1a is a plan view showing a pixel after patterning with the first mask according to the first embodiment of the present invention.
Figure 1B:
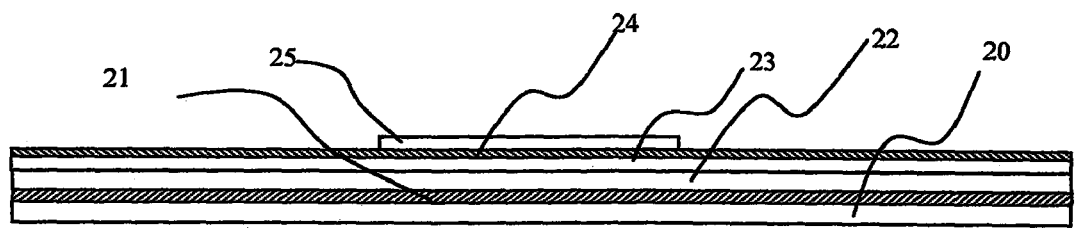
FIGS. 1b and 1c are cross-sectional views along the line A-A' in FIG. 1a during patterning with the first mask according to the first embodiment.

To manufacture an array substrate, as shown in FIG. 1b, in the beginning a gate metal layer 21 is deposited on a clean substrate (e.g., a glass or quartz substrate) 20, a first insulating layer (a gate insulating layer) 22 is deposited on the gate metal layer 21, an active layer (a semiconductor layer) 23 is deposited on the first insulating layer 22, and an ohmic contact layer 24 is deposited on the active layer 23.

The gate metal layer 21 may be a single-layer film of AlNd, Al, Cu, Mo, MoW or Cr, or a composite film of any combination of AlNd, Al, Cu, Mo, MoW, and Cr.

The first insulating layer 22 may be a single-layer film of SiNx, SiOx, or SiOxNy, or a composite film of any combination of SiNx, SiOx, and SiOxNy.

The active layer 23 may be for example a semiconductor layer of mono-crystalline silicon, amorphous silicon (a-Si), polycrystalline silicon (p-Si) and the like.

The ohmic contact layer 24 may be a doped semiconductor layer, e.g., n+ doped a-Si or p+ doped a-Si, and also may be a microcrystalline silicon layer.

The methods for depositing the above layers are generally known in the art, e.g., sputtering, plasma enhanced chemical vapor deposition (PECVD), atmospheric pressure chemical vapor deposition and the like.

The stacked layers of the above-mentioned gate metal layer 21, the first insulating layer 22, the active layer 23, and the ohmic contact layer 24 are patterned with a first mask to form a gate pattern, which comprises a gate electrode 42 and a gate line 41. The gate electrode 42 together with the first insulating layer 22, the active layer 23, and the ohmic contact layer 24 formed thereon forms a gate island 43 for the thin film transistor (TFT) 40. FIG. 1a is a plan view of the substrate after patterning with the first mask, in which the gate electrode 42 branches from the gate line 41.

Figure 1C:
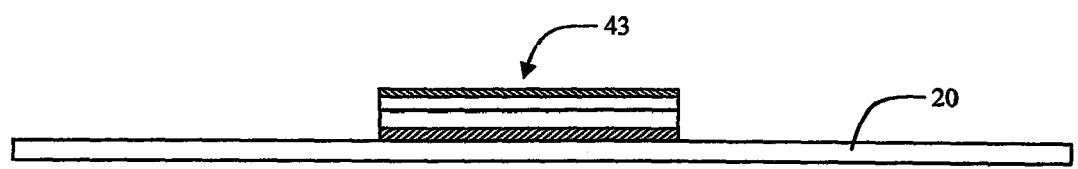

In particular, a photoresist layer is applied or coated (e.g., by spin coating) onto the uppermost ohmic contact layer 24, and then the photoresist layer is exposed with the first mask and developed to form the photoresist pattern 25 corresponding to the gate pattern to be formed, as shown in FIG. 1b. The above-mentioned stacked layers are etched by using the photoresist pattern 25, and the gate line 41 and the gate electrode 42 in the gate island 43 are formed, as shown in FIGS. 1a and 1c.

Then, the second insulating layer 26 and the source/drain metal layer 27 are deposited sequentially on the resultant substrate. The second insulating layer 26, which is similar with the first insulating layer 22, may be a single-layer film of SiNx, SiOx, or SiOxNy, or a composite film of any combination of SiNx, SiOx, and SiOxNy. The source/drain metal layer 27 may be a single-layer film of Mo, MoW or Cr, and can also be a composite film of any combination of Mo, MoW, and Cr.

Figure 2A:
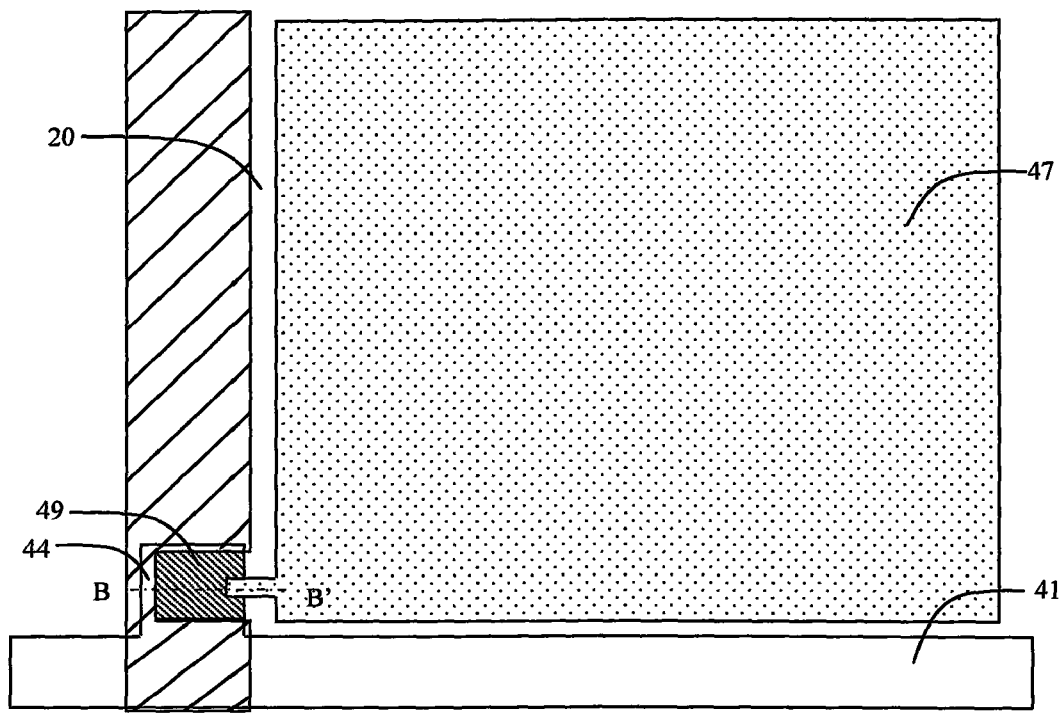
FIG. 2a is a plan view showing a pixel after patterning with the second mask (a gray tone mask) according to the first embodiment of the present invention.

The second insulating layer 26 and the source/drain metal layer 27 are patterned to attain the source electrode 44 and the data line 45 connected with the source electrode, as shown in FIG. 2a, which is a plan view of the substrate after patterning.

Figure 2B:
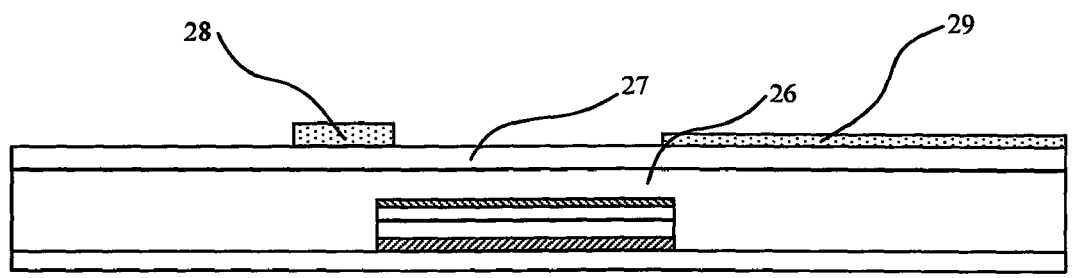
FIG. 2b-2f are cross-sectional views along the line B-B' in FIG. 2a during patterning with the second mask according to the first embodiment.

For example, the patterning may be performed with a second mask which is a gray tone one. More particularly, a photoresist layer is coated onto the source/drain metal layer 27, and then the photoresist layer is exposed with the gray tone mask and developed to form a first gray tone photoresist pattern. The first gray tone photoresist pattern comprises a full photoresist region 28 and a partial photoresist region 29, and the remaining region above the source/drain metal layer 27 is a photoresist-free region, as shown in FIG. 2b. The thickness of the photoresist layer in the full photoresist region 28 is larger than that of the photoresist layer in the partial photoresist region 29. On the substrate, the full photoresist region 28 comprises a data line forming region and a source electrode forming region in the pixel unit; the partial photoresist region 29 comprises a drain electrode forming region and a pixel electrode forming region in the pixel unit; and the photoresist-free region comprises a source forming region, a drain forming region, a channel forming region of the TFT in the pixel unit. The above-mentioned forming regions, such as the source electrode forming region, the source forming region, and the pixel electrode forming region, refer to the portions in the photoresist pattern that correspondingly overlap the regions on the substrate in which the respective elements, such as the source electrode, the source of the TFT, and the pixel electrode, are to be formed.

Figure 2C:
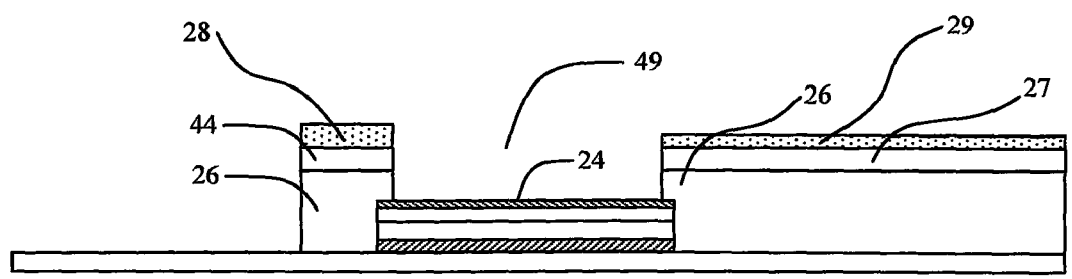

Then, the source/drain metal layer 27 and the second insulating layer 26 are etched sequentially with the first gray tone photoresist pattern, so as to form the source electrode 44 and the data line 45 connected therewith and form an opening 49, which exposes the ohmic contact layer 24, in the second insulating layer 26 on the gate island 43, as shown in FIG. 2c. The exposed ohmic contact layer 24 will be patterned in the subsequent step to form the source region 51, the drain region 52, and the channel region 53 of the TFT, respectively. In addition, the source/drain metal layer 27 within the drain electrode forming region and the pixel electrode forming region on the second insulating layer 26 is left.

Figure 2D:
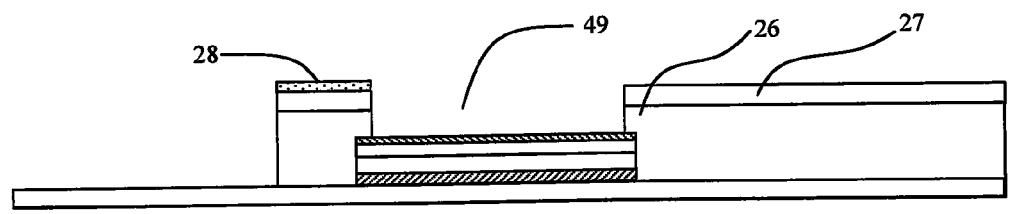

An ashing process is performed on the first gray tone photoresist pattern to remove the photoresist in the partial photoresist region 29 and reduce the thickness of the photoresist in the full photoresist region 28, so as to expose the source/drain metal layer 27 left in the drain electrode forming region and the pixel electrode forming region, as shown in FIG. 2d.

Figure 2E:
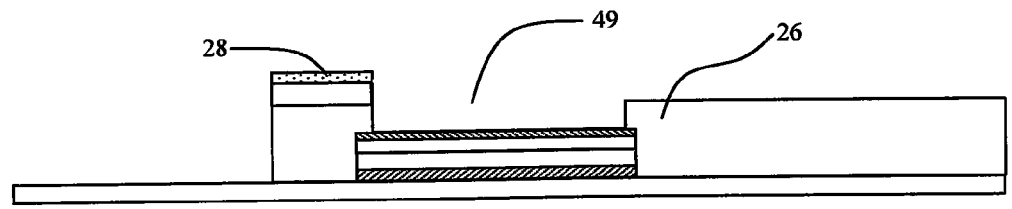
Figure 2F:
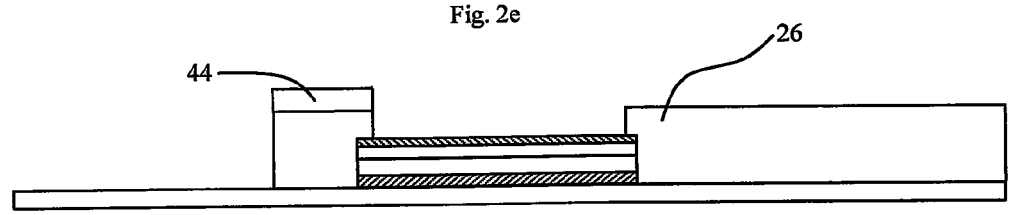

With the photoresist pattern left after the ashing process, the source/drain metal layer 27 in the drain electrode forming region and the pixel electrode forming region is removed by etching, as shown in FIG. 2e. Then, the photoresist left in the full photoresist region 28 after the ashing process is removed with a photoresist lifting-off process, as shown in FIG. 2f.

Next, a pixel electrode material layer 30, such as transparent conductive material such as indium tin oxide (ITO), indium zinc oxide (IZO) and the like, is deposited on the resultant substrate.

Figure 3A:
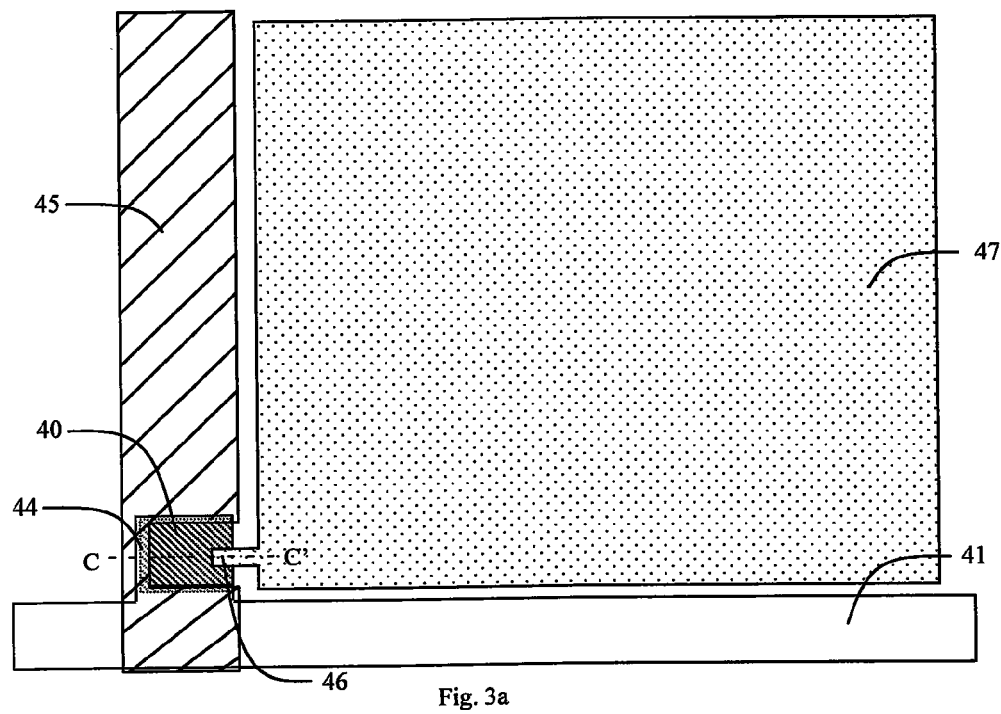
FIG. 3a is a plan view showing a pixel after patterning with the third mask (a gray tone mask) according to the first embodiment of the present invention.

The pixel electrode material layer 30 is patterned to complete the pixel unit comprising the TFT 40 and the pixel electrode 47, as shown in FIG. 3a, which is a plan view of the substrate after this patterning.

Figure 3B:
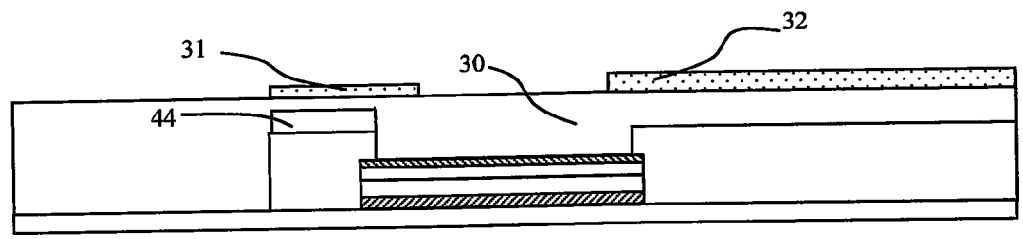
FIG. 3b-3f are cross-sectional views along the line C-C' in FIG. 3a during patterning with the second mask according to the first embodiment.

For example, the patterning may be performed with a third mask which is also a gray tone mask. More particularly, a photoresist layer is applied to the pixel electrode material layer, and then the photoresist layer is exposed by the gray tone mask and developed to form a second gray tone photoresist pattern. The second gray tone photoresist pattern comprises a full photoresist region 32 and a partial photoresist region 31, and the remaining region is a photoresist-free region, as shown in FIG. 3b. The thickness of the photoresist layer in the full photoresist region 32 is larger than that of the photoresist layer in the partial photoresist region 31. On the substrate, the full photoresist region 32 comprises a drain forming region, a drain electrode forming region and a pixel electrode forming region in the pixel unit; the partial photoresist region 31 comprises a source electrode forming region and a source forming region in the pixel unit; and the photoresist-free region comprises a channel forming region in the pixel unit. These forming regions are defined the same as the above-mentioned ones.

Figure 3C:
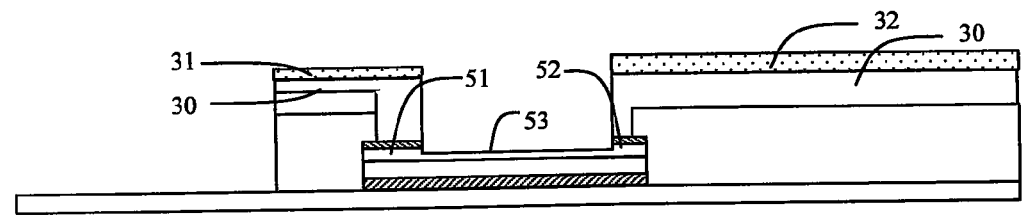

Then, the pixel electrode material layer 30 is etched with the second gray tone photoresist pattern, so as to expose the ohmic contact layer 24 in the opening 49 of the second insulating layer 26 on the gate island 43, and then the ohmic contact layer 24 is patterned by etching to form the channel region 53, the source region 51 and the drain region 52 of the TFT 40. In addition, the source electrode 44 formed on the second insulating layer 26 is connected with the ohmic contact layer 24 in the source region 51 of TFT 40 via the pixel electrode material layer 30 on the source electrode 44. The pixel electrode material layer 30 on the drain forming region, the drain electrode forming region and the pixel electrode forming region forms the drain electrode 46 and the pixel electrode 47, which are integrated with each other and contact the ohmic contact layer 24 in the drain region 52, as shown in FIG. 3c.

Figure 3D:
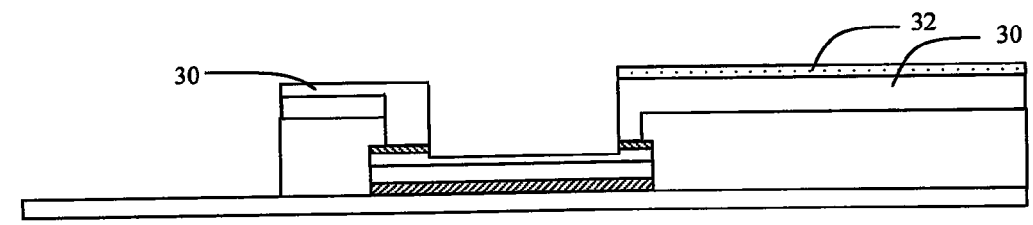

An ashing process is performed on the second gray tone photoresist pattern to remove the photoresist in the partial photoresist region 31 and reduce the thickness of the photoresist in the full photoresist region 32, so as to expose the source electrode 44 and the data line 45 connected therewith, as shown in FIG. 3d.

Figure 3E:
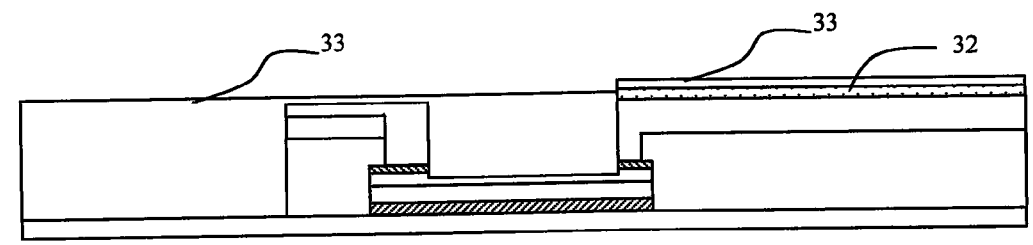
Figure 3F:
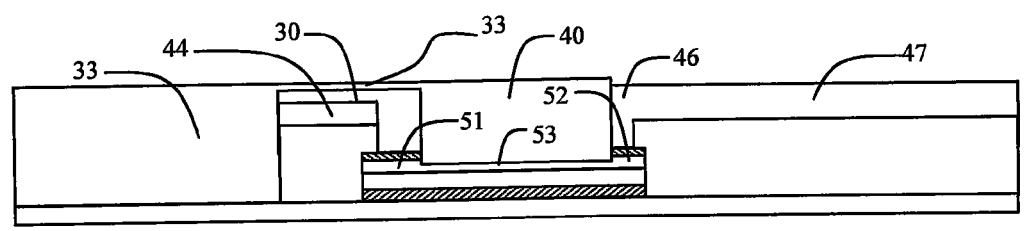

A passivation layer 33 is deposited on the resultant substrate comprising the remaining photoresist pattern, as shown in FIG. 3e. Thereafter, the remaining photoresist pattern in the full photoresist region 32 is lifted off to expose the pixel electrode 47 and the drain electrode 46, so as to obtain the complete pixel unit on the array substrate, as shown in FIG. 3f.

With the manufacturing method according to the first embodiment of the present invention, the TFT-LCD array substrate can be manufactured with just three masks, which include two gray tone masks, in combination with the photoresist lifting-off process.

However, those skilled in the art should appreciate that the conventional mask can be used in place of any of the gray tone mask to realize the same patterning. For example, two conventional masks can be used instead of the first gray tone mask, to form the source electrode, the data line, and the opening in the second insulating layer on the gate island with two photolithography processes.

In another example, the source electrode, the data line, and the drain electrode can be formed at the same time. Thus, in the first gray tone photoresist pattern shown in FIG. 2b, the full photoresist region 28 further comprises the drain electrode forming region; in the step shown in FIG. 3b, the pixel electrode material layer 30 also covers the drain electrode 46; and in the step shown in FIG. 3e, the drain electrode 46 is formed to be connected with the pixel electrode 47 and connected with the ohmic contact layer 24 in the drain region 52 via the pixel electrode material layer 30 thereon in a similar manner as the source electrode 44 does.

In addition, the passivation layer may cover the pixel electrode without being removed, so that when patterning is performed on the pixel electrode, it is not necessary to use the gray tone mask but a conventional mask.

The Second Embodiment

The TFT-LCD array substrate and the manufacturing method thereof according to the second embodiment of the present invention will be described in detail with reference to FIGS. 4a-6f.

In the second embodiment, the elements like those in the first embodiment are indicated with the like reference number, and can be formed with the same materials and methods, the description of which thus will not be repeated herein for simplicity.

Figure 4A:
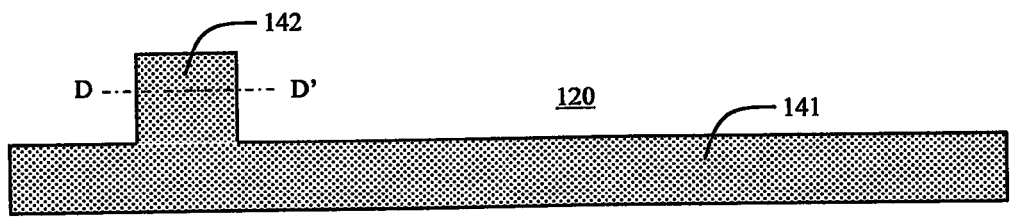
FIG. 4a is a plan view showing a pixel after patterning with the first mask according to the second embodiment of the present invention.
Figure 4B:
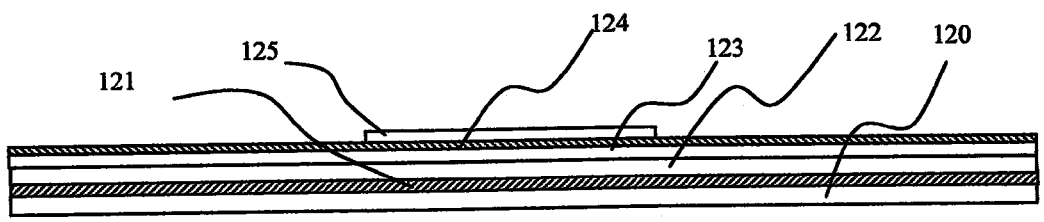
FIGS. 4b and 4c are cross-sectional views along the line D-D' in FIG. 4a during patterning with the first mask according to the second embodiment.

As shown in FIG. 4b, in the beginning a gate metal layer 121 is deposited on a clean substrate 120, a first insulating layer (a gate insulating layer) 122 is deposited on the gate metal layer 121, an active layer (a semiconductor layer) 123 is deposited on the first insulating layer 122, and an ohmic contact layer 124 is deposited on the active layer 123.

The stacked layers of the above-mentioned gate metal layer 121, the first insulating layer 122, the active layer 123, and the ohmic contact layer 124 are patterned with a first mask to form a gate pattern comprising the gate electrode 142 and gate line 141. The gate electrode 142 together with the first insulating layer 122, the active layer 123, and the ohmic contact layer 124 formed thereon forms the gate island 143 for the TFT 140. FIG. 4a is a plan view of the substrate after patterning with the first mask, in which the gate electrode 142 branches from the gate line 141.

Figure 4C:
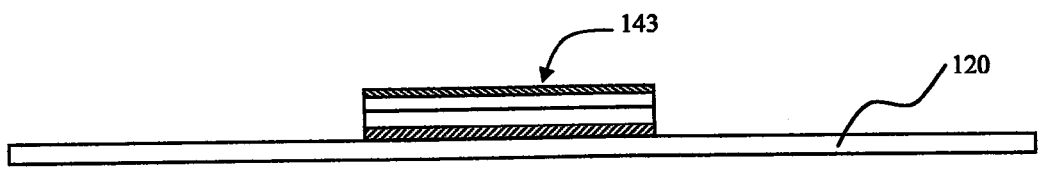

In particular, a photoresist layer is applied onto the uppermost ohmic contact layer 124, and then the photoresist layer is exposed with the first mask and developed to form the photoresist pattern 125 corresponding to the gate pattern to be formed, as shown in FIG. 4b. The above-mentioned stacked layers are etched with the photoresist pattern 125, and the gate line 141 and the gate electrode 142 in the gate island 143 are formed, as shown in FIGS. 4a and 4c.

Figure 5A:
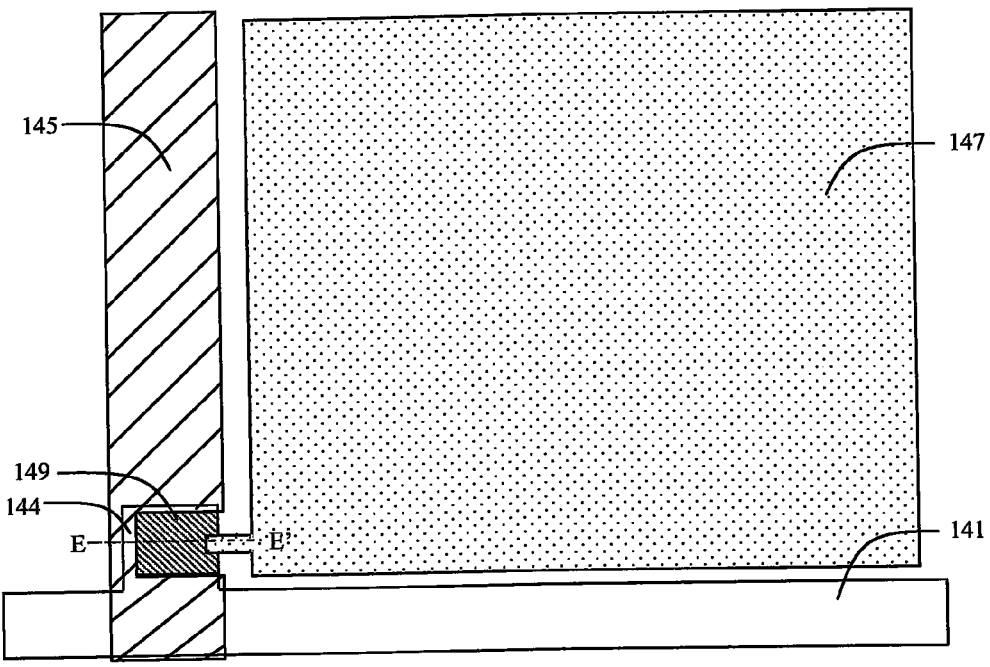
FIG. 5a is a plan view showing a pixel after patterning with the second mask according to the second embodiment of the present invention.
Figure 5B:
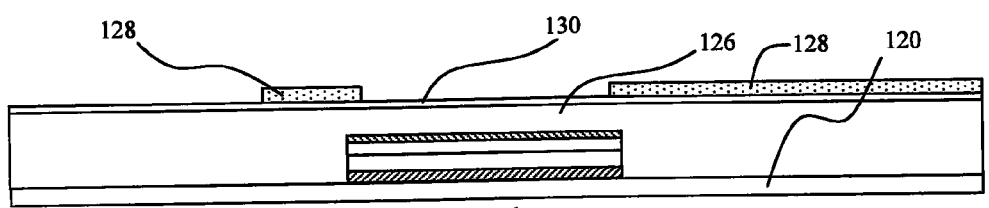
FIG. 5b-5d are cross-sectional views along the line E-E' in FIG. 5a during patterning with the second mask according to the second embodiment.
Figure 5C:
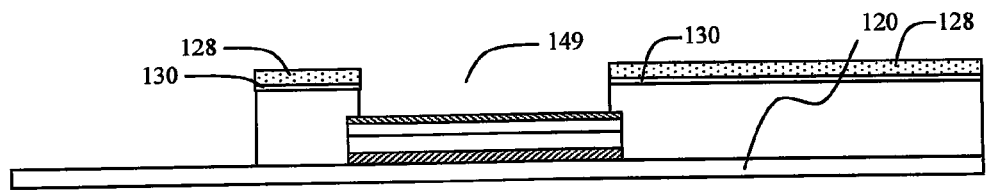
Figure 5D:
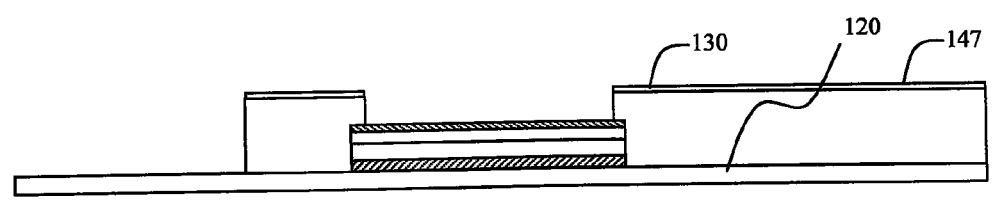

Then, the second insulating layer 126 and the pixel electrode material layer 130 are deposited sequentially on the resultant substrate. The second insulating layer 126 and the pixel electrode material layer 130 are patterned, as shown in FIG. 5a, which is a plan view of the substrate after patterning. More particularly, a photoresist layer is applied onto the pixel electrode material layer 130, and then the photoresist layer is exposed by the second mask and developed to form a photoresist pattern 128, as shown in FIG. 5b. Then, the pixel electrode material layer 130 and the second insulating layer 126 are etched sequentially with the photoresist pattern 128, so as to form the pixel electrode material layer 130 in the source electrode forming region and the drain electrode forming region and form the pixel electrode 147. An opening 149, which exposes the ohmic contact layer 124, is also formed in the second insulating layer 126 on the gate island 143, as shown in FIG. 5c. The exposed ohmic contact layer 124 in the opening 149 will be patterned in the subsequent step to form the source region 151, the drain region 152 and the channel region 153 of the TFT 140, respectively. Then the photoresist pattern 128 is removed, as shown in FIG. 5d.

Figure 6A:
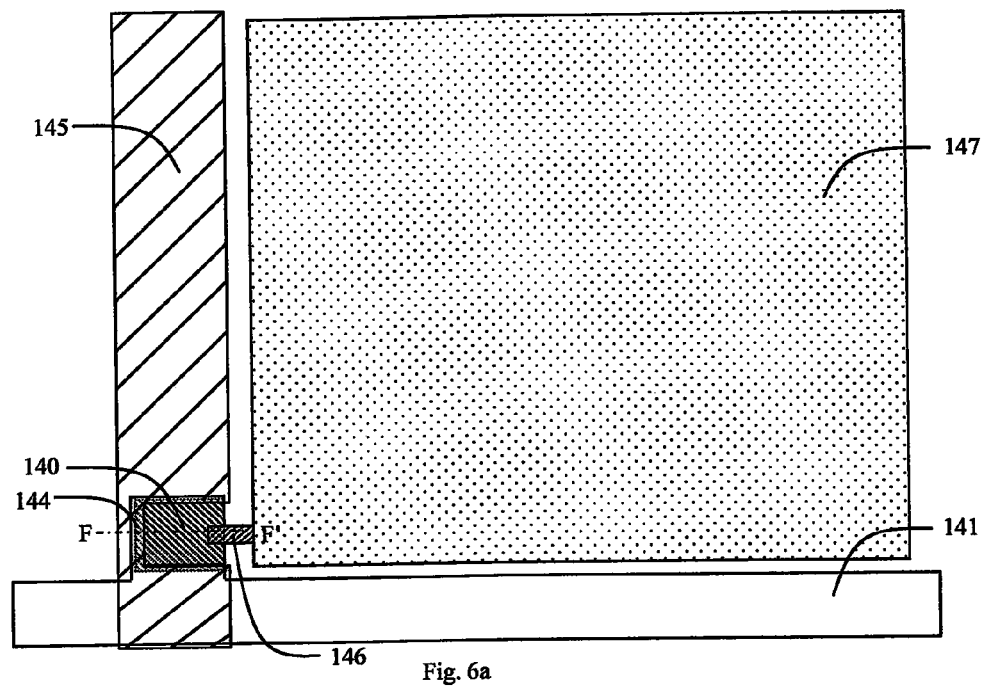
FIG. 6a is a plan view showing a pixel after patterning with the third mask (a gray tone mask) according to the second embodiment of the present invention.

Subsequently, a source/drain metal layer 127 is deposited on the resultant substrate, and is patterned to complete the pixel unit comprising the TFT and the pixel electrode, as shown in FIG. 6a, which is a plan view of the substrate after patterning.

Figure 6B:
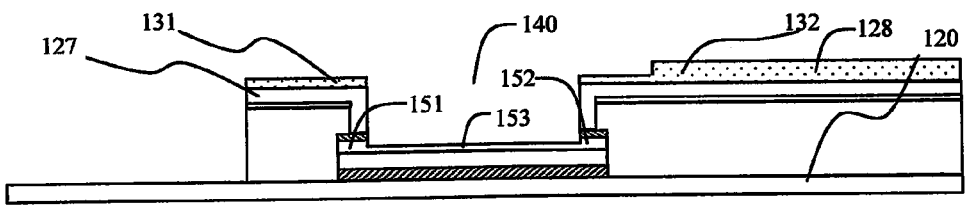
FIG. 6b-6f are cross-sectional views along the line F-F' in FIG. 6a during patterning with the third mask according to the second embodiment.

For example, the patterning may be performed with a third mask which is a gray tone one. More particularly, a photoresist layer is applied onto the source/drain metal layer 127, and then the photoresist layer is exposed by the gray tone mask and developed to form a gray tone photoresist pattern on the substrate. The gray tone photoresist pattern comprises a full photoresist region 132 and a partial photoresist region 131, and the remaining region is a photoresist-free region, as shown in FIG. 6b. The thickness of the photoresist layer in the full photoresist region 132 is larger than that of the photoresist layer in the partial photoresist region 131. On the substrate, the full photoresist region 132 comprises pixel electrode forming region in the pixel unit; the partial photoresist region 131 comprises a data line forming region and a source electrode forming region, a source forming region, a drain electrode forming region, and a drain forming region in the pixel unit; and the photoresist-free region comprises a channel forming region in the pixel unit. These forming regions are defined the same as the above-mentioned ones in the first embodiment.

Then, the source/drain metal layer 127 is etched with the gray tone photoresist pattern, so as to expose the ohmic contact layer 124 in the opening 149 in the second insulating layer 126 on the gate island 143, and then the ohmic contact layer 124 is further etched to form the channel region 153, the source region 151 and the drain region 152 of the TFT 140. In addition, through the etching the source electrode 144, the data line 145, and the drain electrode 146 are formed on the second insulating layer 126, wherein the source electrode 144 is connected with the ohmic contact layer 124 in the source region 151 of the TFT 140, and the drain electrode 146 is connected with the ohmic contact layer 124 in the drain region 152 and the pixel electrode 147 of the TFT 140, respectively, as shown in FIG. 6b.

Figure 6C:
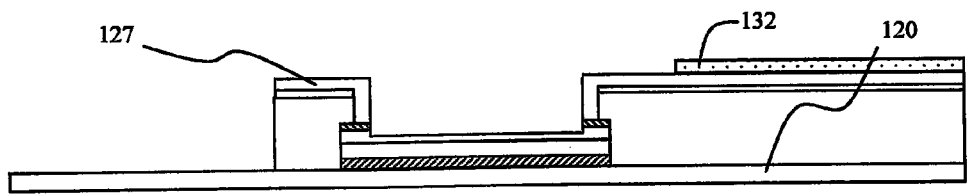

An ashing process is performed on the gray tone photoresist pattern to remove the photoresist in the partial photoresist region 131 and reduce the thickness of the photoresist in the full photoresist region 132, so as to expose the source electrode 144, the data line 145, and the drain electrode 146, as shown in FIG. 6c.

Figure 6D:
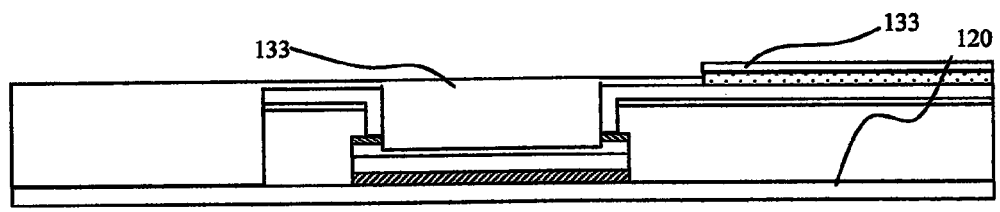
Figure 6E:
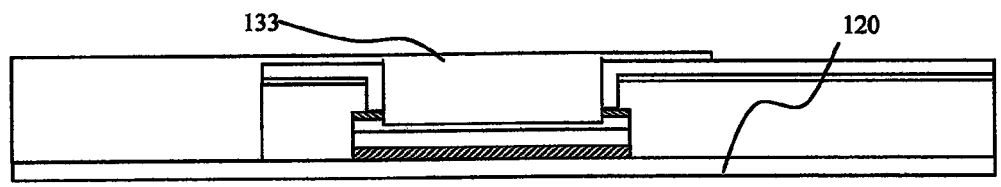
Figure 6F:
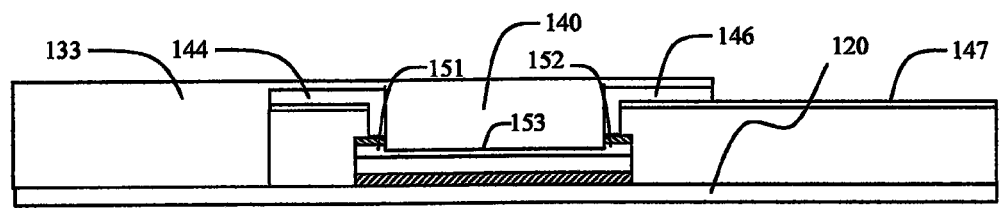

A passivation layer 133 is deposited on the resultant substrate comprising the remaining photoresist pattern, as shown in FIG. 6d. At this time, the remaining photoresist pattern is lifted off to expose the pixel electrode forming region which is covered by the source/drain metal layer 127, as shown in FIG. 6e. Then, the source/drain metal layer 127 in the pixel electrode forming region is etched by using the remaining passivation layer 133 as the etching mask, so as to obtain the complete pixel unit on the array substrate, as shown in FIG. 6f.

With the manufacturing method according to the second embodiment of the present invention, the TFT-LCD array substrate can be manufactured with just three masks, which include a gray tone mask, in combination with the photoresist lifting-off process.

However, those skilled in the art will appreciate that the conventional mask can be used in place of the above gray tone mask to realize the same patterning. For example, after the deposition of the source/drain metal layer 127, two conventional masks can be used instead of the gray tone mask, to expose the channel region of the active layer on the gate island and form the source electrode, the data line and the drain electrode in one photolithography process, and form the pixel electrode in another photolithography process and then the passivation layer is deposited, in which case the passivation layer over the pixel electrode may not be removed, or after the passivation layer is deposited, the another one photolithography process is performed to remove the passivation layer in the pixel forming region to form the pixel electrode.

In addition, in the step shown in FIG. 5d, there may be no pixel electrode material layer remained in the source electrode forming region and the drain electrode forming region on the second insulating layer 126.

In the present invention, the source and drain electrodes of the TFT is connected with the ohmic contact layers in the source and drain region directly by contacting with the ohmic contact layers or indirectly via other conductive layer, such as the pixel electrode material layer, that contacts with the ohmic contact layer.

It should be appreciated that the embodiments described above are intended to illustrate but not limit the present invention. Although the present invention has been described in detail herein with reference to the preferred embodiments, it should be understood by those skilled in the art that the present invention can be realized with different material and equipment as necessary, and that various modification and equivalents thereof can be made herein without departing from the spirit and scope of the present invention.

What is claimed is:

1. A manufacturing method of a pixel unit of a TFT-LCD array substrate, comprising the steps of:

depositing sequentially on a substrate stacked layers of a gate metal layer, a first gate insulating layer, an active layer, and an ohmic contact layer, and then patterning the stacked layers to form a gate island;

depositing sequentially a second insulating layer and a pixel electrode material layer on the substrate, patterning the second insulating layer and the pixel electrode material layer, so as to form an opening on the gate island to expose the ohmic contact layer in a source region, a drain region, and a channel region of the TFT and form a pixel electrode;

depositing a source/drain metal layer on the substrate, and patterning the source/drain metal layer and the ohmic contact layer exposed in the opening, so as to form on the second insulating layer a source electrode connected with the ohmic contact layer in the source region and a drain electrode connected with the ohmic contact layer in the drain region, and remove the ohmic contact layer on the channel region; and depositing a passivation layer on the substrate.

2. The manufacturing method according to claim 1, wherein the passivation layer on the pixel electrode is removed to expose the pixel electrode.

3. The manufacturing method according to claim 1, wherein during patterning the pixel electrode layer, the pixel electrode material layer is left in a source electrode forming region and a drain electrode forming region on the second insulating layer, so as to form the source electrode and the drain electrode on the pixel electrode material layer.

4. The manufacturing method according to claim 1, wherein the source/drain metal layer is patterned with a first gray tone mask.

5. The manufacturing method according to claim 4, wherein patterning with the first gray tone mask comprises the steps of:

forming a first photoresist layer on the source/drain metal layer;

exposing and developing the first photoresist layer with the first gray tone mask to form a first gray tone photoresist pattern, comprising a first full photoresist region that comprises a pixel electrode forming region, a first photoresist-free region that comprises a channel forming region, and a first partial photoresist region that comprises a source electrode forming region, a source forming region, a drain electrode forming region, and a drain forming region; and etching the source/drain metal layer.

6. The manufacturing method according to claim 5, further comprises:

processing the first gray tone photoresist pattern after etching the source/drain metal layer to completely remove the photoresist in the first partial photoresist region and reduce the thickness of the photoresist in the first full photoresist region;

depositing the passivation layer on the substrate, and lifting off the remaining first photoresist pattern to remove the passivation layer thereon; and etching the exposed source/drain metal layer to expose the pixel electrode.

* * * * *